United States Patent [19]

Shirato

[11] Patent Number: 5,128,739
[45] Date of Patent: Jul. 7, 1992

[54] MIS TYPE SEMICONDUCTOR DEVICE FORMED IN A SEMICONDUCTOR SUBSTRATE HAVING A WELL REGION

[75] Inventor: Takehide Shirato, Hiratsuka, Japan

[73] Assignee: Fujitsu Limited, Kawasaki, Japan

[21] Appl. No.: 616,806

[22] Filed: Nov. 19, 1990

Related U.S. Application Data

[63] Continuation of Ser. No. 175,578, Mar. 29, 1988, abandoned, which is a continuation of Ser. No. 930,089, Nov. 13, 1986, abandoned, which is a continuation of Ser. No. 678,686, Dec. 5, 1984, abandoned.

[30] Foreign Application Priority Data

Dec. 7, 1983 [JP] Japan ............................ 58-230862

[51] Int. Cl.[5] ............................................. H01L 27/02
[52] U.S. Cl. .................................. 357/42; 357/23.11; 357/52
[58] Field of Search .................... 357/42, 23.8, 23.11, 357/23.3, 23.13, 52, 90

[56] References Cited

U.S. PATENT DOCUMENTS

| | | | |
|---|---|---|---|
| 3,751,722 | 8/1973 | Richman | 357/23.11 X |
| 3,946,419 | 3/1976 | De Witt et al. | 357/23.11 OR |
| 4,104,784 | 8/1978 | Klein | 357/42 X |
| 4,132,998 | 1/1979 | Dingwall | 357/23.3 OR |
| 4,306,916 | 12/1981 | Wollesen et al. | 357/42 X |
| 4,435,895 | 3/1984 | Parrillo et al. | 357/42 X |
| 4,468,852 | 9/1984 | Cerofolini | 357/52 X |
| 4,480,375 | 11/1984 | Cottrell et al. | 357/42 X |
| 4,599,789 | 7/1986 | Gasner | 357/42 X |
| 4,633,289 | 12/1986 | Chen | 357/42 |

FOREIGN PATENT DOCUMENTS

| | | | |
|---|---|---|---|
| 0057024 | 8/1982 | European Pat. Off. | 357/23.13 |
| 2801085 | 1/1977 | Fed. Rep. of Germany | |
| 53-80172 | 7/1978 | Japan | 357/23.3 |
| 0136275 | 10/1979 | Japan | 357/23.11 |
| 0111171 | 8/1980 | Japan | 357/23.3 |
| 1153428 | 5/1969 | United Kingdom | |

OTHER PUBLICATIONS

Webster's Ninth New Collegiate Dictionary, Merriam-Webster, Inc., 1984, pp. 104, 341, 342.
Patent Abstracts of Japan, vol. 6, No. 259, Dec. 17, 1982 (E-149) [1137].
International Electron Devices Meeting, Dec. 13–15, 1982, Paper 29-3, pp. 706–709, "Twin-Tub CMOS II–an advanced VLSI Technology" (IEEE).
European Search Report, the Hague, Aug. 12, 1985, Examiner: D. L. D. Morvan.

*Primary Examiner*—Andrew J. James
*Assistant Examiner*—Sara W. Crane
*Attorney, Agent, or Firm*—Staas & Halsey

[57] ABSTRACT

In order to provide semiconductor devices having a high switching speed and high packing density of the circuit elements, a p-MOSFET of a CMOS IC is formed on an n-type well which has a higher impurity concentration compared with that of the n-type substrate region and which is formed at selected portions under the p-MOSFET. In order to decrease the capacitance of the source and drain of the p-MOSFET, the n-type well regions are selectively formed only at portions under the gate electrode and the field insulating layer, and a junction of the p$^+$-type drain and source region is formed directly on a part of the n$^-$-type substrate region. As a result, the latch-up phenomenon can be suppressed and the junction capacitance of the devices becomes smaller. Therefore, the switching speed and the packing density of the CMOS IC are improved.

2 Claims, 4 Drawing Sheets

MIS TYPE SEMICONDUCTOR DEVICE FORMED IN A SEMICONDUCTOR SUBSTRATE HAVING A WELL REGION

This is a continuation of co-pending application(s) Ser. No. 07/175,578 filed on Mar. 29, 1988, now abandoned, which is a continuation of application Ser. No. 06/930,089, filed Nov. 13, 1986, now abandoned, which is a continuation of application Ser. No. 06/678,686, filed Dec. 5, 1984, now abandoned.

BACKGROUND OF THE INVENTION

This invention relates to a semiconductor device, and in particular, it relates to a structure of a metal insulator semiconductor (MIS) type field effect transistor (FET) device. This invention is most advantageously applicable to fabrication of complementary metal oxide semiconductor (CMOS) devices for improving the switching speed of the devices.

In the field of large scale integration (LSI) devices, CMOS is used widely. In order to improve the switching speed and the packing density of CMOS, reducing the channel of CMOS has been proposed.

Generally, in a conventional structure of a CMOS integrated circuit (IC), a p-type well region is formed in an n-type semiconductor substrate by introducing into a portion of the substrate a sufficient amount of a p-type impurity to compensate the substrate n-type impurity. A p-channel type MOS FET (P-MOSFET) is formed on the n-type substrate, and an n-channel type MOS FET (n-MOSFET) is formed on the p-type well region. In order to increase the switching speed and packing density of CMOS, it is advantageous to reduce the channel length. The n-MOSFET is formed on the p-type well region having an impurity of high concentration without difficulty. However, it is difficult to reduce the channel length of the p-MOSFET formed on the n-type substrate having an impurity of low concentration. One of the problems is a "punch-through effect" of the MOSFET, wherein the punch-through effect is occasionally caused on a substrate of an impurity of low concentration. When a voltage is applied across the electrode on a source region and a drain region, depletion layers from each region extend to the portion under the gate to cause a punch-through current to flow between the source region and the drain region. As a result, performance of the MOSFET is disturbed by the punch-through effect.

In a prior method for fabricating the MOSFET, a structure of a "twin-tub" has been used in order to prevent such a punch-through effect. The twin-tub has been proposed as a structure suitable for reducing channel length of MOSFETs formed on the substrate.

FIG. 1 is a schematic and partial cross-sectional view of a structure of the twin-tub of a prior art MOSFET device. A p-type well region 2 and an n-type well region 3 are formed on the surface of the semiconductor substrate 1. The well regions have the same and opposite conductivity types with high impurity concentrations compared with that of the substrate. An n-MOSFET and a p-MOSFET are formed on the well regions 2 and 3 respectively. In FIG. 1, reference numeral 1 is an n⁻-type silicon (Si) substrate; 2 is a p-type well region; 3 is an n-type well region; 4 is a field oxide film (isolation element); 5 is a p⁺-type channel cut region; 6 is an n⁺-type channel cut region; 7a and 7b are gate oxide films; 8a and 8b are gate electrodes; 9a is an n⁺-type drain region; 9b is an n⁺-type source region; n-MOS designates an n-channel MOSFET; and p-MOS designates a p-channel MOSFET.

In the conventional structure of the above-described "twin-tub" MOSFET device, one major drawback is that the junction capacitance between the P⁺-type drain region 10a and the n-type well region 3 becomes large. The parasitic drain capacitance functions as a load in switching operations, and the switching speed of the p-channel MOSFET is decreased. When a reverse-bias voltage is applied across the source region, the switching speed of the MOSFET also is disturbed by the junction capacitance of the source region.

SUMMARY OF THE INVENTION

It is an object of the present invention to provide a semiconductor device having a high switching speed of the circuit elements by improving reduced channel.

Another object of the present invention is to provide a MISFET device which can improve the switching speed of the circuit elements.

A further object of the present invention is to provide a semiconductor fabrication method which can simplify the formation of a channel-cut region of a circuit element.

The foregoing objects are accomplished in a semiconductor device in accordance with the present invention by selectively forming a well region of an impurity of high concentration and of the same conductivity type as the semiconductor substrate. The well region having the same conductivity type and a higher impurity concentration than the substrate is selectively formed at portions where the MOSFET of a conduction channel type opposite to the substrate conductivity type is to be formed; but excepting formation from at least a portion under the drain region of the MOSFET. Since the well region has an impurity of high concentration compared with that of the substrate, the punch-through effect between the source region and the drain region is prevented. Since the junction area between the drain region of the MOSFET and the well can be reduced and despite the high impurity concentration of the well, the junction capacitance of the drain becomes smaller than that of the conventional twin-tub semiconductor fabrication method. Since an impurity concentration of the well region can advantageously be higher than that formed by a conventional twin-tub fabrication method, the well region can serve the channel-cut function in place of the conventional channel-cut region. It can be formed without any additional fabricating process for forming the highly doped n-type region. One more advantage of the use of the well region for channel-cut in the place of a conventional shallow channel-cut region is the improvement in preventing latch-up phenomenon which disturbs normal operation in CMOS ICs. Low resistivity of deeper portions of the substrate by the well region is effective to prevent the latch-up.

According to the present invention, the channel length of a CMOS IC can be reduced. As a result of the present invention, the CMOS IC can provide a high speed and stable operation with very low power consumption.

These and other objects will become apparent from the following detailed description of the preferred embodiments taken in connection with the accompanying drawings.

BRIEF DESCRIPTION OF THE DRAWINGS

Same or like reference numerals denote the same or like parts throughout the drawings.

DESCRIPTION OF THE PREFERRED EMBODIMENTS

The present invention will be disclosed referring to preferred embodiments.

Figure 1:
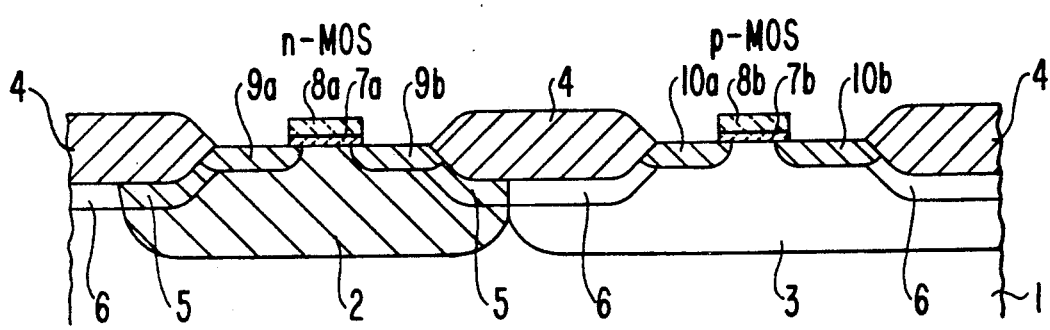
FIG. 1 is a schematic cross-sectional view of a twin-tub MOSFET prior art device.

FIGS. 2 through 5 respectively illustrate schematically cross-sectional views of four embodiments of a semiconductor device of the present invention. The structure of the present invention is applicable to fabrication of a MOS transistor which is formed on a CMOS IC substrate. Compared to the structure of the prior art semiconductor device as shown in FIG. 1, the present invention combines the contact regions for the p+-type drain region and n--type silicon substrate region to a single junction. In the figures, reference numeral 11 indicates an n--type silicon (Si) substrate which has a doping concentration approximately in the range of $5 \times 10^{14}$ (atm/cm$^3$); 12 is a p-type well region which has a doping concentration approximately in the range of $5 \times 10^{16}$ (atm/cm$^3$) and is 3 μm-4 μm deep; 13 is an n-type well region under a field oxide film and a gate oxide film, which has a doping concentration approximately in the range of $5 \times 10^{16}$ (atm/cm$^3$), and is 3 μm-4 μm deep; 14 is a p-type channel cut region 15 is a field oxide film (isolation layer); 16a and 16b are gate oxide films; 17a and 17b are polycrystalline silicon gate electrodes; 18a is a p+-type drain region; 18b is a p+-type source region; 19a is an n+-type drain region; 19b is an n+-type source region; and $n_1^-$ is a region having an impurity of low concentration corresponding to the substrate 11, which has a specific profile of impurity concentration. The details of the $n_1^-$ region will be disclosed later with reference to FIG. 3.

Figure 2:
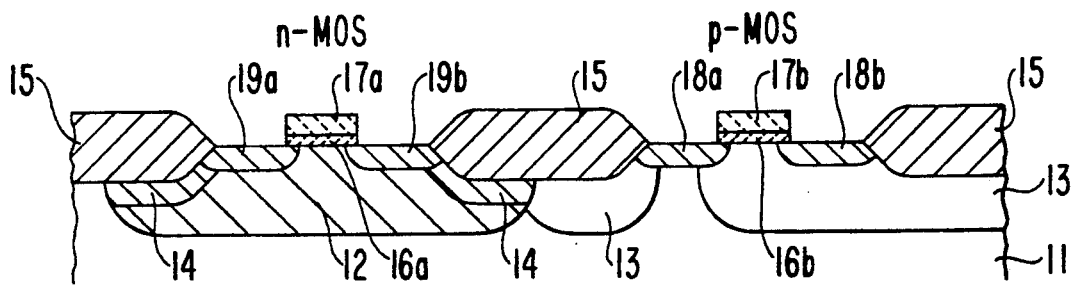
FIG. 2 is a schematic cross-sectional view of a first embodiment of the semiconductor device of the present invention.

In the first embodiment of FIG. 2, the present invention is applied to the p-MOSFET in an n-type well 13 formed directly on the n--type substrate 11. The well region 13 is selectively formed at portions under the gate electrode 17b, the p+-type source region 18b and the field insulating layer 15, but not formed in the portion under the p+-type drain region 18a and the portion of the p-type well region 12. As the result, the junction capacitance of the p+-type drain region 18a becomes smaller. Therefore, the switching speed of the device in the CMOS IC is improved.

Figure 3:
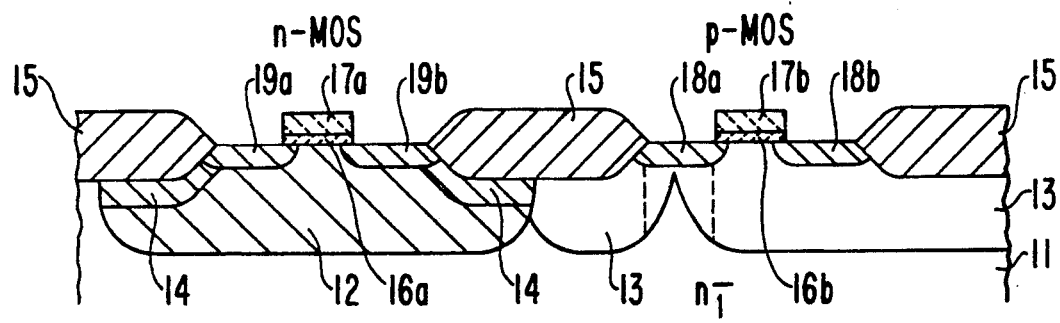
FIG. 3 is a schematic cross-sectional view of a second embodiment of the semiconductor device of the present invention, in which the device structure of FIG. 2 is reduced with the shape of the well being modified by an annealing process.

FIG. 3 illustrates schematically a cross-sectional view of the second embodiment, in which the device structure of FIG. 2 is reduced with the shape of the well 13 being modified by an annealing process. In FIG. 3, the same reference numerals denote the same parts as in FIG. 2. Unlike the structure of FIG. 2, the gap of the well 13 under the p+-type drain region 18a is reduced. As the scale of integration of the semiconductor device increases and the sizes of the drain region and source region are scaled down, when a p-MOSFET of the CMOS IC is formed on an n-type well region 13 having a higher impurity concentration compared with that of the substrate region 11, an $n_1^-$ region may be formed at the portion under p+-type drain region 18a by an annealing process. That is, the $n_1^-$ region may be formed by the annealing process of the semiconductor substrate in order to diffuse and activate doping material for forming impurity regions, such as the source and drain regions. The details of the annealing process will be further described later with respect to FIG. 6D. In the annealing process, since a part of well regions 13 is diffused laterally, the $n_1^-$ region is formed at the portion under P+-type drain region 18a. The $n_1^-$ region has an impurity of low concentration corresponding to the n--type substrate to form a p-n junction of a low impurity concentration with the drain region 18a. Tnerefore, the drain-substrate capacitance of the contact region $n_1^-$ becomes smaller compared with that of the conventional twin-tub structure of the prior art CMOS FET. As a result, the switching speed of such a device in the CMOS IC can be improved.

Figure 4:
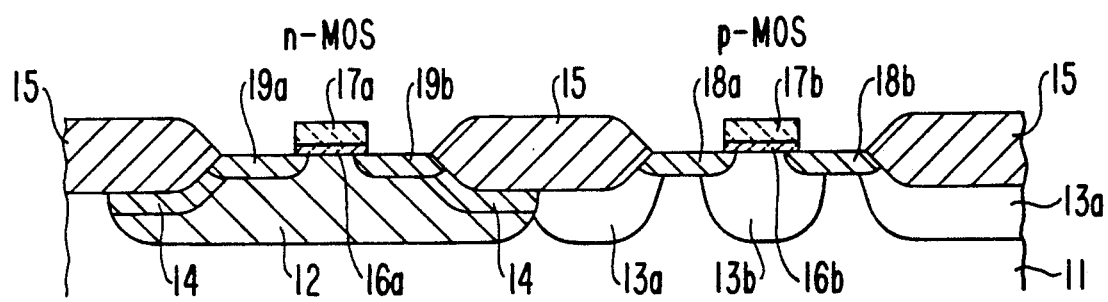
FIG. 4 is a schematic cross-sectional view of a third embodiment of the semiconductor device of the present invention.

FIG. 4 illustrates schematically a cross-sectional view of the third embodiment of the present invention. The third embodiment is especially adaptable to a device in which a bias potential is applied between the substrate and the source region 18b. In this embodiment, the n-type well regions are not formed under parts of both the p+-type drain region 18a and the p+-type source region 18b. More particularly, the drain region 18a and the source region 18b are contacted directly to the n--type substrate 11 which has an impurity of low concentration. Therefore, the junction capacitance of both the source region 18b and the drain region 18a becomes smaller. Accordingly, the switching speed of the device in the CMOS IC is improved.

Figure 5:
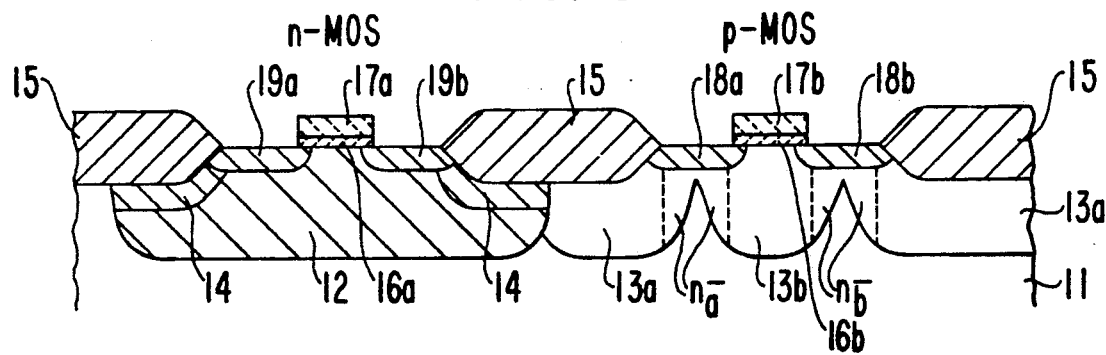
FIG. 5 is a schematic cross-sectional view of a fourth embodiment of the semiconductor device of the present invention, in which the device structure of FIG. 4 is reduced with the shape of the wells being modified by an annealing process.

FIG. 5 illustrates schematically a cross-sectional view of the fourth embodiment of the invention, in which the device structure of FIG. 4 is reduced with the shape of the wells being modified by the annealing process. The structure of FIG. 4 is scaled down similar to the second embodiment shown in FIG. 3. When a p-MOSFET of the CMOS IC is formed on the n-type well regions 13 and 13b having a higher impurity concentration compared with that of the substrate region 11, the n-type region 13a and 13b extend under the drain and source regions 18a and 18b by lateral diffusion from both sides. Nevertheless, the device of the third embodiment has small parasitic junction capacitance characteristics due to the low concentration impurity profile around the portions under source and drain regions 18a and 18b. As shown in FIG. 5, new n$^-$ regions $n_a^-$ and $n_b^-$ are formed respectively under the drain region 18a and the source region 18b by the annealing process. Although the n$^-$ regions $n_a^-$ and $n_b^-$ have a slightly higher impurity concentration as compared to the n$^-$ substrate, the n$^-$ regions have a low impurity concentration generally corresponding to the substrate 11 which has a specific profile of impurity concentration compared to that of n-type well regions 13a and 13b. Therefore, the junction capacitance of such source and drain regions becomes smaller. Accordingly, the switching speed of the device in the CMOS IC is improved.

According to the present invention and as described above, the n-type well regions are formed at portions under the gate electrode of the p-channel MOSFET, but omitted at a portion under the source or drain region, or both. The n-type well regions are deeper than the source and the drain regions and have an impurity of high concentration as compared with that of the substrate. Therefore, the punch-through effect is prevented which otherwise would be generated between the source region and the drain region at portion 13b shown in FIGS. 4 and 5.

Accordingly, the channel length of the p-channel MOSFET can be reduced as compared to a conventional twin-tub fabricated semiconductor device by increasing the impurity concentration so that the junction capacitance of the source and the drain is maintained at a constant level. As a result, the CMOS IC by the present invention is provided with superior characteristics of high speed and stable operation with very low power consumption.

As described above, the portion of the n-type well region located under the field insulating layer 15, such as portion 13a shown in FIGS. 4 and 5, may be used to serve the channel-cut function. This portion 13a also is effective, as compared with a conventional shallow channel-cut region, to suppress the latch-up phenomenon which is caused by parasitic pnpn elements inevitably formed in a CMOS and which is detrimental to normal operations. This is because the portion 13a of the n-type well regions is effective to reduce resistivity at deeper portions of the substrate 11. It is known in the art that the parasitic pnpn elements may possibly be triggered to latch-up by a noise pulse when the condition for conduction of the pnpn elements is sufficed. One important factor of this condition is a sufficiently large voltage drop across a parasitic resistor inside the substrate to forward bias a neighboring pn junction. The low resistivity of deeper portions of the substrate by the well region 13a is effective to reduce the voltage drop inside the substrate.

The process for fabricating the semiconductor device of the present invention now will be described with reference to FIGS. 6A–6G.

FIGS. 6A to 6G illustrate schematically steps in the method for fabricating a CMOS IC device by the present invention, with particular reference to fabricating the embodiment shown in FIG. 4. The processing techniques used in this fabrication method, such as etching, insulating layer formation, aluminum sputtering, photo-lithographic technology, etc., are conventional ones being well known in the art. Therefore, a detailed description regarding these technologies are omitted in the following disclosure. In FIGS. 6A to 6G, same or like reference numerals denote the same or like parts through the drawings.

Figure 6A:
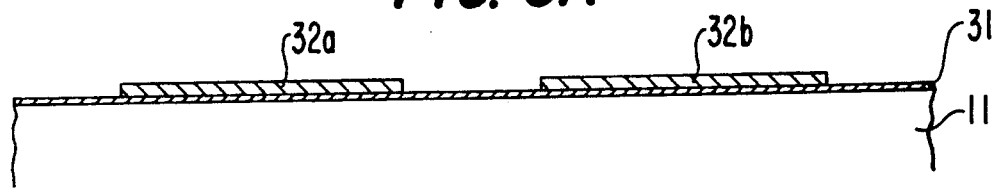
FIGS. 6A to 6G are schematic cross-sectional views of different steps in the fabrication method for a semiconductor device of the present invention.

FIG. 6A illustrates a step of fabricating or forming a silicon nitride film on selected portions of the substrate. Using conventional processing such as thermal oxidation, a thin oxide film 31 of 500 Å thick is formed on the n-type silicon substrate 11 having an impurity concentration of $5 \times 10^{14}$ (atm/cm$^3$). Subsequently, a silicon nitride (Si$_3$N$_4$) film of about 0.1 µm thick is deposited by a conventional chemical vapor deposition (CVD) method on the thermal oxide film 31. Patterning the silicon nitride (Si$_3$N$_4$) film by conventional dry etching, the silicon nitride (Si$_3$N$_4$) films 32a and 32b are selectively formed at portions corresponding to a prospective area of an n-MOSFET region and a p-MOSFET region respectively.

Figure 6B:
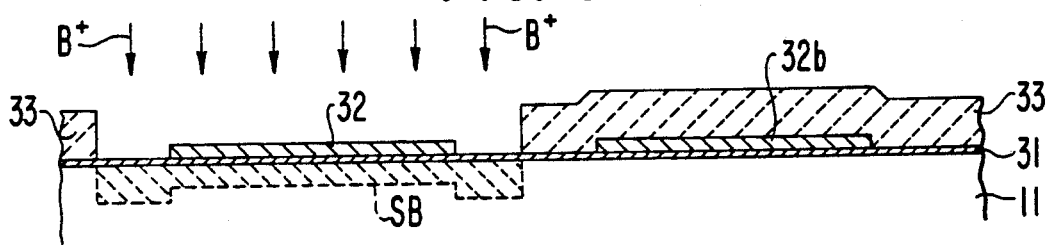

FIG. 6B illustrates a step of fabricating or forming a boron doped region for a p-type well. A first resist mask 33 which has an opening corresponding to a prospective area of the p-type well region is formed by the photo-lithographic process. Subsequently, boron (B) is selectively ion-implanted into the opening of the p-type well region through the thin oxide film 31 and the silicon nitride (Si$_3$N$_4$) film 32a, with a doping density in the range of approximately $10^{13}$ (atm/cm$^2$) and an acceleration voltage of 160 (keV). In FIG. 6B, reference numeral B+ designates boron ions, and S$_B$ designates a boron ion-implanted region.

Figure 6C:
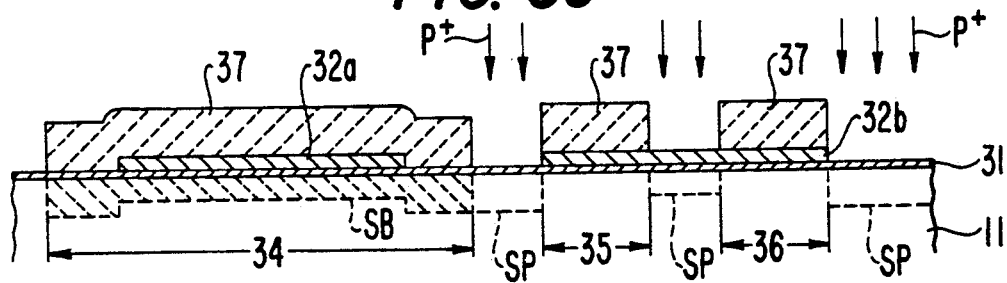

FIG. 6C illustrates a step of fabricating or forming a phosphorus doped region for an n-type well. The first resist mask 33 is removed by conventional ashing. Subsequently, a second resist mask 37 is formed on the substrate. The mask 37 covers p well region 34, drain region 35 and source region 36. That is, the second resist mask 37 has openings corresponding to a prospective area of a gate electrode and a field oxide layer. Phosphorus ions (P+) are selectively implanted into the openings of the silicon substrate 11 through thin oxide film 31 and the silicon nitride (Si$_3$N$_4$) film 32b, with a doping density approximately in the range of $5 \times 10^{12}$ (atm/cm$^2$) and an acceleration voltage of 180 (keV). This doping rate is slightly higher than that of the conventional twin-tub semiconductor fabrication method. As a result, phosphorus ions (P+) are selectively implanted into the portions under the gate electrode of the p-MOSFET and a field isolation region for the p-MOSFETs on the substrate 11. In FIG. 6C, reference numeral P+ designates phosphorus ions and Sp designates a phosphorus ion-implanted region.

Figure 6D:
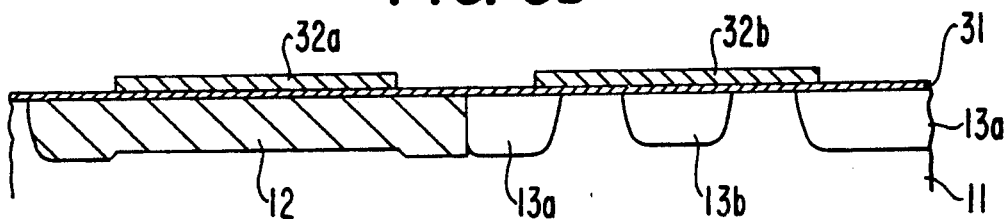

FIG. 6D illustrates an annealing process for the p-type and n-type wells. The second resist mask 37 is removed by conventional ashing. Subsequently, an annealing is performed in a nitrogen atmosphere at a temperature of 1200° C. for 180 minutes to form a p-type well region 12 and n-type well regions 13a and 13b. The phosphorus ions (P+) are diffused into the substrate 11 by the annealing process, and p-type well region 12 and n-type well regions 13a and 13b having a depth in the range of 3 µm to 4 µm are formed. The n-type well regions 13a and 13b are formed on portions under the gate electrode and field oxide film, but at least no well region is formed under the drain region in the embodiment of FIG. 2 or under the drain and source regions in the embodiment of FIG. 4. The n regions under the gate electrode 17b and the field oxide layer 15 may expand to form the n$_1$$^-$ region by diffusion in the annealing process. This corresponds to the embodiments of FIGS. 3 and 5. The n$_1$$^-$ regions have an impurity of lower concentration as compared to the n-type well regions.

Figure 6E:
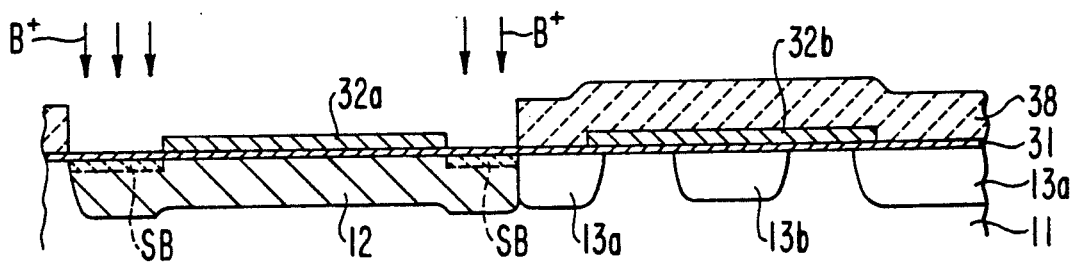

FIG. 6E illustrates a step of fabricating or forming a boron doped region for p-type channel-cut. A surface opening of the p-type well region 12 is exposed on the substrate 11. A third resist mask 38 is formed on the p-MOSFET region. Subsequently, boron (B) is selectively ion-implanted into the opening of the p-type well region 12 through thin oxide film 31, and using the silicon nitride (Si$_3$N$_4$) film patterns 32a as a mask and a doping density of boron approximately in the range of $5 \times 10^{13}$ (atm/cm$^2$). In FIG. 6E, reference numeral B$^+$ designates boron ions, and S$_B$ designates the boron ion-implanted region.

Figure 6F:
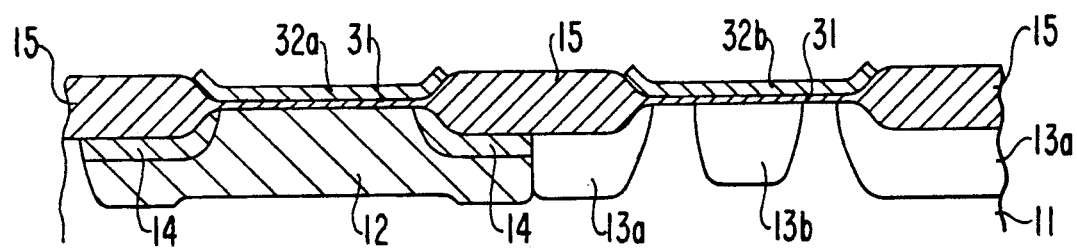

FIG. 6F illustrates a step of fabricating or forming a field oxide layer. Resist mask 38 is removed by conventional ashing. Subsequently, the field oxide layer 15 is formed on the substrate 11 at portions uncovered by the nitride (Si$_3$N$_4$) films 32a and 32b, by a conventional thermal oxidation process. The boron (B) ion-implanted region S$_B$ in FIG. 6E becomes a p-type channel-cut region 14. For the p-channel device, the n-type well region 13a can serve the channel-cut function because it may have a high impurity concentration as compared to p-type well region 12. In this case, it is not necessary to form an n-type channel-cut region with an impurity of high concentration on the surface of the n-type well 13a.

Figure 6G:
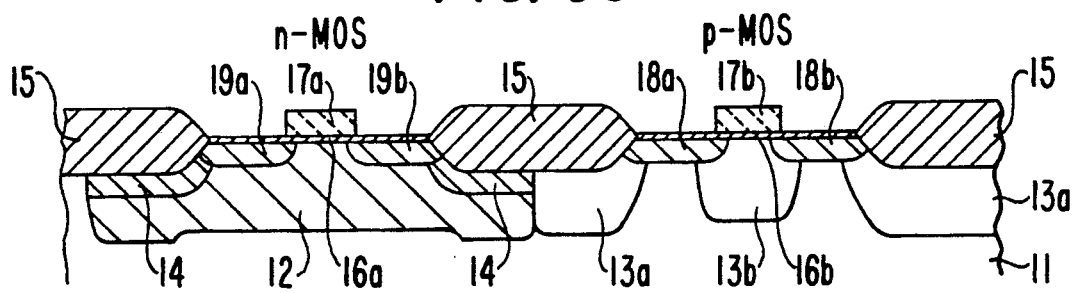

FIG. 6G illustrates a step of fabricating or forming the gate electrodes, drain region and source region. The silicon nitride (Si$_3$N$_4$) film patterns 32a, 32b and thin oxide film 31 are removed by conventional etching. Subsequently, the gate oxide layer 16a and 16b are formed newly on the surfaces of the p-MOSFET region and the n-MOSFET region by a conventional thermal oxidation process. This step is followed by forming a polycrystalline silicon layer having a thickness in the range of 4000 Å to 5000 Å. This layer is formed by conventional chemical vapor deposition (CVD) and is heavily doped with n-type dopant by conventional gas diffusion or ion-implantation. The n$^+$-type polycrystalline silicon are etched to form the silicon gate electrodes 17a and 17b. The silicon gate pattern is formed using conventional photolithographic technology with reactive-ion etching. The p-MOS region is covered with a fourth resist mask (not shown), and arsenic ion (As$^+$) is implanted with a high dose in the n-MOS region by using the gate electrode 17a as the mask. The fourth resist mask is removed by conventional ashing, and the n-MOS region is covered with a fifth resist mask (not shown). Boron ions (B$^+$) are implanted with a high dose in the p-MOS region by using the gate electrode 17b as the mask.

Next, the fifth resist mask (not shown) is removed by conventional ashing. Subsequently, annealing is performed to activate the arsenic (As) and boron (B) of the dopant. As a result, the p$^+$-type drain region 18a, the p$^+$-type source region 18b, the n$^+$-type drain region 19a, and the n$^+$-type source region 19b are formed respectively.

Finally, but not shown in FIG. 6, the exposed parts of the gate oxide layers 16a and 16b out from the gate electrodes 17a and 17b are removed by conventional etching. Subsequently, the formation of the oxide film for surface protection, the formation of the contact window, and the formation of the wiring are performed. The entire surface of the substrate is coated with a phosphosilicate glass (PSG) insulating layer. As described above, the CMOS IC of the present invention does not require any additional fabricating process for the IC.

In summary and according to the present invention, the n-type well regions are formed under the gate electrode and the field insulating layer of the p-channel MOSFET, but not the drain region or the drain and source regions. The n-type well regions are deeper diffusion regions as compared with the source and the drain regions. The n-type well regions also have an impurity of high concentration as compared to the substrate. Therefore, the punch-through effect occurring between the source region and the drain region is prevented. The channel length of the p-channel MOSFET also can be reduced. As a result, the junction capacitance of the source and the drain becomes smaller as compared to a conventional twin-tub fabricated semiconductor device. Moreover, the impurity concentration of the n-type well region of this device may be higher than that of the conventional twin-tub fabricated device, so that the n-type well region under the field oxide layer can be used as a channel-cut region. Therefore, no additional fabricating process for the channel-cut region of high impurity concentration is necessary.

The disclosure of the present invention has been made with regard to a CMOS IC as the invention is particularly adaptable to such ICs. Many variations, however, may occur to one skilled in the art based upon this disclosure. For example, the present invention could be applicable to an n-MIS IC or a p-MIS IC.

What is claimed is:

1. A high speed complementary metal oxide semiconductor (C-MOS) field effect transistor (FET) for high speed operation having a short channel length, comprising:

a semiconductor substrate having a first conductivity type and a first impurity concentration;

a field insulation layer formed over said substrate for separating elements formed in said substrate from each other;

a first well region formed in said substrate, said first well region having a second conductivity type which is opposite the first conductivity type;

a first field effect transistor formed in said first well region, having a first conductivity type channel and having a channel stopper formed in said first well region beneath said field insulation layer, said channel stopper having an impurity concentration higher than the impurity concentration of said first well region;

a second well region formed in portions of said substrate and adjoining said first well region, and having a first conductivity type and a higher impurity concentration than said first impurity concentration;

a second field effect transistor formed in said second well region, having a second conductivity type channel, having a source region and having a drain region, said second well region extending under said channel of said second FET and under portions of said source region and said drain region where said source and drain regions are in contact with said field insulation layer, said second well region further extending under said field insulation layer adjacent said portions of said source and drain regions and having a sufficiently high impurity concentration to provide a channel stop function under said field insulation layer, said second well region being eliminated from a bottom portion of at least one of said source and drain regions of said second field effect transistor so as to reduce the associated junction capacitance; and a lateral diffusion region adjacent to said drain region and said source region of said second field effect transistor, said lateral diffusion region having a lower impurity concentration than that of said second well region.

2. A high speed complementary metal oxide semiconductor (C-MOS) field effect transistor (FET) for high speed operation having a short channel length, comprising:
- a semiconductor substrate having a first conductivity type and a first impurity concentration;
- a field insulation layer formed over said substrate for separating elements formed in said substrate from each other;
- a first well region formed in said substrate, said first well region having a second conductivity type opposite the first conductivity type;
- a first field effect transistor formed in said first well region, having a first conductivity type channel and having a channel stopper formed in said first well region beneath said field insulation layer, said channel stopper having an impurity concentration higher than the impurity concentration of said first well region;
- a second well region formed in portions of said substrate and adjoining said first well region, and having a first conductivity type and a higher impurity concentration than said first impurity concentration;
- a second field effect transistor formed in said second well region, having a second conductivity type channel, having a source region and having a drain region, said second well region extending under said channel and said source region and under portions of said drain region of said second FET; and
- a lateral diffusion region adjacent to said drain region of said second field effect transistor, said lateral diffusion region having a lower impurity concentration than that of said second well region.

* * * * *